United States Patent
Teh et al.

(10) Patent No.: US 11,509,312 B1
(45) Date of Patent: Nov. 22, 2022

(54) APPARATUS AND A METHOD FOR SYNCHRONIZING OUTPUT CLOCK SIGNALS ACROSS A PLURALITY OF PHASE-LOCKED LOOPS

(71) Applicant: SKYECHIP SDN BHD, Pulau Pinang (MY)

(72) Inventors: Chee Hak Teh, Pulau Pinang (MY); Soon Chieh Lim, Pulau Pinang (MY); Ging Yeon Mark Wong, Pulau Pinang (MY); How Hwan Wong, Pulau Pinang (MY)

(73) Assignee: SKYECHIP SDN BHD, Bayan Lepas (MY)

( * ) Notice: Subject to any disclaimer, the term of this patent is extended or adjusted under 35 U.S.C. 154(b) by 0 days.

(21) Appl. No.: 17/561,792

(22) Filed: Dec. 24, 2021

(30) Foreign Application Priority Data

Sep. 23, 2021 (MY) .............................. PI2021005582

(51) Int. Cl.
*H03L 7/07* (2006.01)
*H03L 7/085* (2006.01)

(52) U.S. Cl.
CPC ................ *H03L 7/07* (2013.01); *H03L 7/085* (2013.01)

(58) Field of Classification Search
CPC .................................. H03L 7/07; H03L 7/085
See application file for complete search history.

(56) References Cited

U.S. PATENT DOCUMENTS

| | | | | |
|---|---|---|---|---|
| 6,252,419 B1 * | 6/2001 | Sung | .......................... | H03L 7/18 326/38 |
| 7,276,936 B1 * | 10/2007 | Hoang | ............... | H03K 19/1774 326/38 |
| 7,405,628 B2 * | 7/2008 | Hulfachor | ................. | H03L 7/18 331/11 |
| 7,616,657 B2 * | 11/2009 | Shumarayev | ........... | H04L 27/00 370/518 |
| 7,791,370 B1 * | 9/2010 | Hoang | ...................... | G06F 1/10 326/38 |
| 7,821,312 B1 * | 10/2010 | Zheng | ..................... | H03L 7/093 327/158 |
| 8,228,102 B1 * | 7/2012 | Pham | ...................... | H03L 7/183 327/147 |

(Continued)

FOREIGN PATENT DOCUMENTS

JP 2012130003 A * 7/2012 ............... G06F 1/10

*Primary Examiner* — Adam D Houston
(74) *Attorney, Agent, or Firm* — Aslan Law, P.C.

(57) ABSTRACT

An apparatus and a method for synchronizing output clock signals across a plurality of phase-locked loops (PLLs). The apparatus coupled within each PLL comprises: a local counter configured to provide a count when receiving a reference clock signal; a comparator configured to compare the count from the local counter with a predetermined or preconfigured value; wherein a multiplexor connected to the local counter and counters of adjacent PLLs, configured to select the count from the local counter or a count from the counters of the adjacent PLLs; wherein the selected count from the multiplexor is incremented and directed to the local counter; wherein an output clock divider enable is asserted to the PLL to start an output clock divider to generate the output clock signal when the count from the local counter reaches the predetermined or preconfigured value.

8 Claims, 4 Drawing Sheets

(56) References Cited

U.S. PATENT DOCUMENTS

| | | | |
|---|---|---|---|
| 9,306,730 B1* | 4/2016 | Shu | H03L 7/081 |
| 9,503,109 B2 | 11/2016 | McLaurin et al. | |
| 9,979,408 B2* | 5/2018 | Mayer | H03L 7/087 |
| 9,998,129 B1* | 6/2018 | Zhuang | H03L 7/1976 |
| 10,116,315 B1* | 10/2018 | Zhuang | H04L 7/033 |
| 10,514,720 B1* | 12/2019 | J | H03L 7/087 |
| 10,560,104 B2* | 2/2020 | Li | H04L 7/0025 |
| 10,608,649 B1* | 3/2020 | Jayakumar | H03L 7/093 |
| 10,931,291 B1* | 2/2021 | Patnaik | H03L 7/093 |
| 11,296,860 B2* | 4/2022 | Sridharan | H03L 7/1976 |
| 2015/0084676 A1* | 3/2015 | McLaurin | H03L 7/23 |
| | | | 327/142 |
| 2017/0324419 A1* | 11/2017 | Mayer | H03L 7/0891 |
| 2018/0138899 A1* | 5/2018 | Tee | H03L 7/0992 |
| 2021/0111859 A1* | 4/2021 | Gaade | H03L 7/0998 |

* cited by examiner

APPARATUS AND A METHOD FOR SYNCHRONIZING OUTPUT CLOCK SIGNALS ACROSS A PLURALITY OF PHASE-LOCKED LOOPS

CROSS-REFERENCE TO RELATED APPLICATIONS

This application claims priority to MY Patent Application No. PI2021005582 filed on Sep. 23, 2021, the entire contents of which are hereby incorporated by reference.

TECHNICAL FIELD

The present invention relates generally to electronic systems. More particularly, the present invention relates to an apparatus and a method for synchronizing output clock signals across a plurality of phase-locked loops (PLLs).

BACKGROUND ART

Phase-locked loops (PLLs) can be used in a variety of applications for generating an output clock signal having a controlled phase and frequency relationship to a reference clock signal. PLLs can be employed in, for example, telecommunication systems and chip-to-chip communication.

Numerous efforts have been made to provide improved phase synchronization of PLLs. Some of the efforts are discussed in the following references.

U.S. Pat. No. 9,503,109B2 discloses apparatus and methods for synchronizing PLLs. In certain implementations, a fractional-N synthesizer includes a PLL and a control circuit that controls a division value of the PLL. The control circuit includes an interpolator, a reset phase adjustment calculator, and a synchronization circuit. The interpolator can control a fractional portion of the PLL's division value. The reset phase adjustment calculator can include a counter for counting a number of cycles of the reference clock signal since initialization of the fractional-N synthesizer, and the reset phase adjustment calculator can generate a phase adjustment signal based on the count. The synchronization circuit can synchronize the PLL in response to a synchronization signal, and can correct for a synchronization phase error indicated by the phase adjustment signal.

U.S. Pat. No. 9,979,408B2 teaches apparatus and methods for phase synchronization of PLLs. In certain configurations, an RF communication system includes a PLL that generates one or more output clock signals and a phase synchronization circuit that synchronizes a phase of the PLL. The phase synchronization circuit includes a sampling circuit that generates samples by sampling the one or more output clock signals based on timing of a reference clock signal. Additionally, the phase synchronization circuit includes a phase difference calculation circuit that generates a phase difference signal based on the samples and a tracking digital phase signal representing the phase of the PLL. The phase synchronization circuit further includes a phase adjustment control circuit that provides a phase adjustment to the PLL based on the phase difference signal so as to synchronize the PLL.

The aforementioned references and other relevant solutions may strive to provide improved phase synchronization of PLLs. Nevertheless, they still have a number of limitations and shortcomings. For example, they do not provide a solution to synchronize and align the phases of all output clock signals across two or more PLLs.

FIG. 1 illustrates an internal structure of a prior art PLL. A reference clock (refclk) signal passes through a phase detector, a loop filter and a voltage-controlled oscillator (VCO). The output from the VCO is looped back to the phase detector via a feedback divider. The divisor N of the feedback divider is the factor that determines the multiplicator effect on the VCO. The VCO from the PLL is generally not used directly because it is configured to be of very high frequency with the high multiplication factor N. Therefore, an output clock divider is applied at the VCO to generate a lower and functional frequency output clock signal.

In a multi-PLL system, the output clock signals are normally not aligned, even the same division is configured for the output clock dividers of the multiple PLLs. FIG. 2 is an example timing diagram of output clock signals generated by four prior art PLLs. The four prior art PLLs share the same reference clock signal, feedback divider divisor, and output clock divider divisor. However, there can still be four possible phase relationships between the output clock signal at PLL-0 and the output clock signal at PLL-1/PLL-2/PLL-3. The output clock signal at any of the PLLs can be at 0-degree, 90-degree, 180-degree or 270-degree in relative to the other output clock signals and this presents a problem for systems that require the output clock signal phases to be aligned.

Accordingly, there remains a need to have an apparatus and a method for synchronizing output clock signals across a plurality of PLLs.

SUMMARY OF THE INVENTION

The following presents a simplified summary of the invention in order to provide a basic understanding of some aspects of the invention. This summary is not an extensive overview of the invention. Its sole purpose is to present some concepts of the invention in a simplified form as a prelude to the more detailed description that is presented later.

It is an objective of the present invention to provide an apparatus which can synchronize output clock signals across a plurality of phase-locked loops (PLLs).

It is also an objective of the present invention to provide an apparatus which is configurable such that one or more PLL synchronization groups can be created and rearranged.

It is also an objective of the present invention to provide a method for synchronizing output clock signals across a plurality of PLLs.

Accordingly, these objectives may be achieved by following the teachings of the present invention. The present invention relates to an apparatus for synchronizing output clock signals across a plurality of PLLs, wherein the apparatus coupled within each PLL comprises: a local counter configured to provide a count when receiving a reference clock signal; a comparator configured to compare the count from the local counter with a predetermined or preconfigured value; characterized by a multiplexor connected to the local counter and counters of adjacent PLLs, configured to select the count from the local counter or a count from the counters of the adjacent PLLs; wherein the selected count from the multiplexor is incremented and directed to the local counter; wherein an output clock divider enable is asserted to the PLL to start an output clock divider to generate the output clock signal when the count from the local counter reaches the predetermined or preconfigured value.

The present invention also relates to a method for synchronizing output clock signals across a plurality of PLLs. The method is characterized by the steps of: providing a count by a local counter when receiving a reference clock signal for each PLL; selecting the count from the local counter or a count from counters of adjacent PLLs by a multiplexor connected to the local counter and the counters of the adjacent PLLs; incrementing the count selected by the multiplexor; directing the incremented count to the local counter; comparing the count from the local counter with a predetermined or preconfigured value by a comparator; and asserting an output clock divider enable to the PLL to start an output clock divider to generate the output clock signal when the count from the local counter reaches the predetermined or preconfigured value.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

So that the manner in which the above recited features of the present invention can be understood in detail, a more particular description of the invention, briefly summarized above, may have been referred by embodiments, some of which are illustrated in the appended drawings. It is to be noted, however, that the appended drawings illustrate only typical embodiments of this invention and are therefore not to be considered limiting of its scope, for the invention may admit to other equally effective embodiments.

These and other features, benefits, and advantages of the present invention will become apparent by reference to the following text figures, with like reference numbers referring to like structures across the views, wherein.

DETAILED DESCRIPTION OF THE INVENTION

Figure 1:
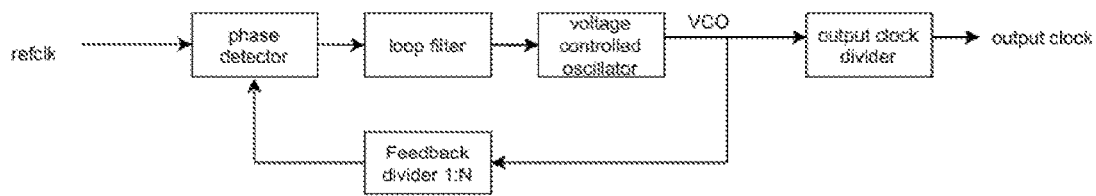
FIG. 1 illustrates an internal structure of a prior art phase-locked loop (PLL)
Figure 2:
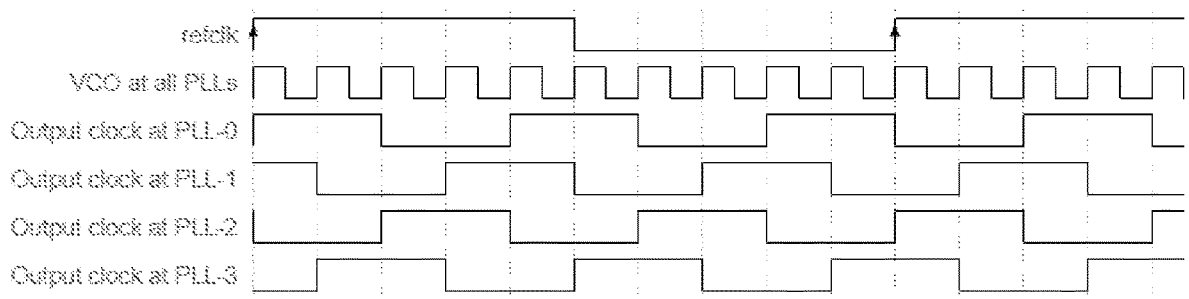
FIG. 2 is an example timing diagram of output clock signals generated by four prior art PLLs.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting but merely as a basis for claims. It should be understood that the drawings and detailed description thereto are not intended to limit the invention to the particular form disclosed, but on the contrary, the invention is to cover all modifications, equivalents and alternatives falling within the scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to. Further, the words "a" or "an" mean "at least one" and the word "plurality" means one or more, unless otherwise mentioned. Where the abbreviations or technical terms are used, these indicate the commonly accepted meanings as known in the technical field.

The present invention is described hereinafter by various embodiments with reference to the accompanying drawings, wherein reference numerals used in the accompanying drawings correspond to the like elements throughout the description. This invention may, however, be embodied in many different forms and should not be construed as limited to the embodiment set forth herein. Rather, the embodiment is provided so that this disclosure will be thorough and complete and will fully convey the scope of the invention to those skilled in the art. In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary, and are not intended to limit the scope of the invention.

Referring to the drawings, the invention will now be described in more details.

Figure 3:
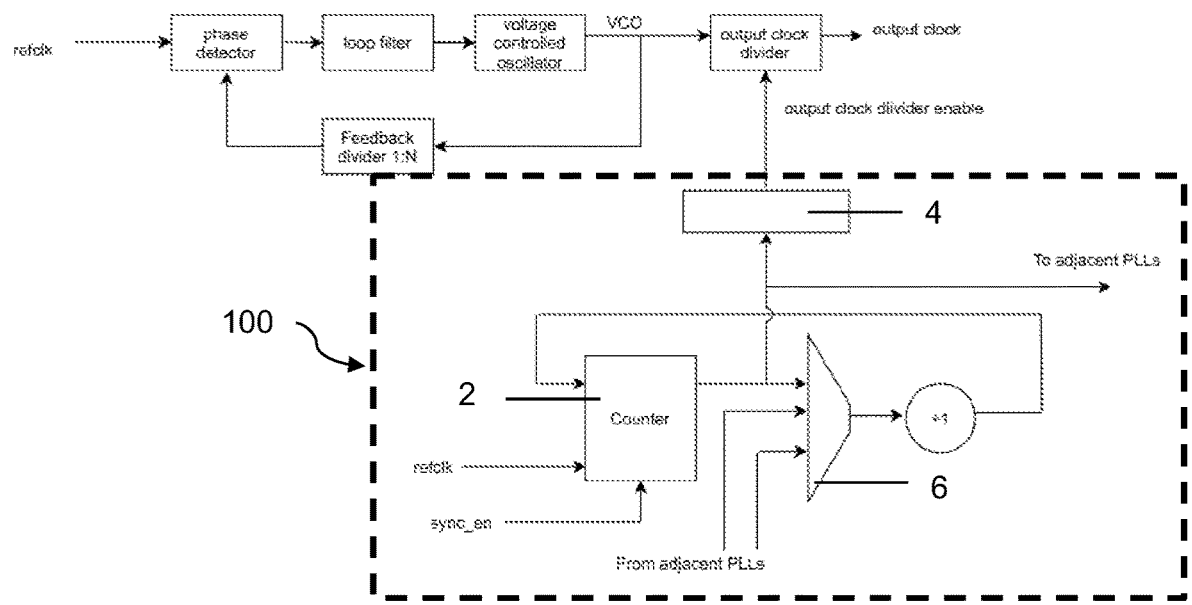
FIG. 3 illustrates an apparatus connected within a PLL for synchronizing output clock signals across a plurality of PLLs in accordance with an embodiment of the present invention.

FIG. 3 illustrates an apparatus (100) connected within a PLL for synchronizing output clock signals across a plurality of phase-locked loops (PLLs) in accordance with an embodiment of the present invention, wherein the apparatus (100) comprises: a local counter (2) configured to provide a count when receiving a reference clock (refclk) signal; a comparator (4) configured to compare the count from the local counter (2) with a predetermined or preconfigured value; characterized by a multiplexor (6) connected to the local counter (2) and counters (2) of adjacent PLLs, configured to select the count from the local counter (2) or a count from the counters (2) of the adjacent PLLs; wherein the selected count from the multiplexor (6) is incremented and directed to the local counter (2); wherein an output clock divider enable is asserted to the PLL to start an output clock divider to generate the output clock signal when the count from the local counter (2) reaches the predetermined or preconfigured value.

In accordance with an embodiment of the present invention, the plurality of PLLs is divided into multiple synchronization groups by configuring the multiplexors (6) for separate synchronization of the output clock signals. For example, if there are five PLLs required to be divided into two synchronization groups, each multiplexor (6) of the five PLLs can be configured so that the output clock signal of the first PPL can be synchronized with that of the second PLL while the output clock signal of the third PLL can be synchronized with that of the fourth and fifth PLLs. Each multiplexor (6) of the five PLLs can be further configured so that the output clock signal of the first PPL can be synchronized with that of the fifth PLL while the output clock signal of the third PLL can be synchronized with that of the second and fourth PLLs. The synchronization groups can be created and rearranged as per required by configuring the multiplexors (6).

In accordance with an embodiment of the present invention, the predetermined or preconfigured value is the same for each PLL in the same synchronization group. For instance, if there are two synchronization groups, the predetermined or preconfigured value is the same among the PLLs in the first synchronization group while the predetermined or preconfigured value is the same among the PLLs in the second synchronization group. Further, the predetermined or preconfigured value can be a value that is at least the number of reference clock signal cycles required for the count to propagate across all the PLLs in one synchronization group.

In accordance with an embodiment of the present invention, the local counter (2) is enabled by a synchronization enable (sync_en) signal. For example, the local counter (2) is initially disabled and subsequently enabled by the synchronization enable signal when the PLL output clock signal synchronization process is initiated.

In accordance with an embodiment of the present invention, the reference clock signal of the local counter (2) is the same as the clock signal that drives the PLL.

In accordance with an embodiment of the present invention, the output clock divider of each PLL comprises same or different divisors in dividing the output clock signal. For example, if output clock signals of two PLLs are being synchronized and the first PLL's output divider divisor is 4, the second PLL's output divider divisor can be 2 or 4.

The present invention also relates to a method for synchronizing output clock signals across a plurality of PLLs. The method is characterized by the steps of: providing a count by a local counter (2) when receiving a reference clock signal for each PLL; selecting the count from the local counter (2) or a count from counters (2) of adjacent PLLs by a multiplexor (6) connected to the local counter (2) and the counters (2) of the adjacent PLLs; incrementing the count selected by the multiplexor (6); directing the incremented count to the local counter (2); comparing the count from the local counter (2) with a predetermined or preconfigured value by a comparator (4); and asserting an output clock divider enable to the PLL to start an output clock divider to generate the output clock signal when the count from the local counter (2) reaches the predetermined or preconfigured value.

In accordance with an embodiment of the present invention, the method further comprises the step of dividing the plurality of PLLs into multiple synchronization groups by configuring the multiplexors (6) for separate synchronization of the output clock signals.

Hereinafter, examples of the present invention will be provided for more detailed explanation. The advantages of the present invention may be more readily understood and put into practical effect from these examples. However, it is to be understood that the following examples are not intended to limit the scope of the present invention in any ways.

EXAMPLES

Figure 4:
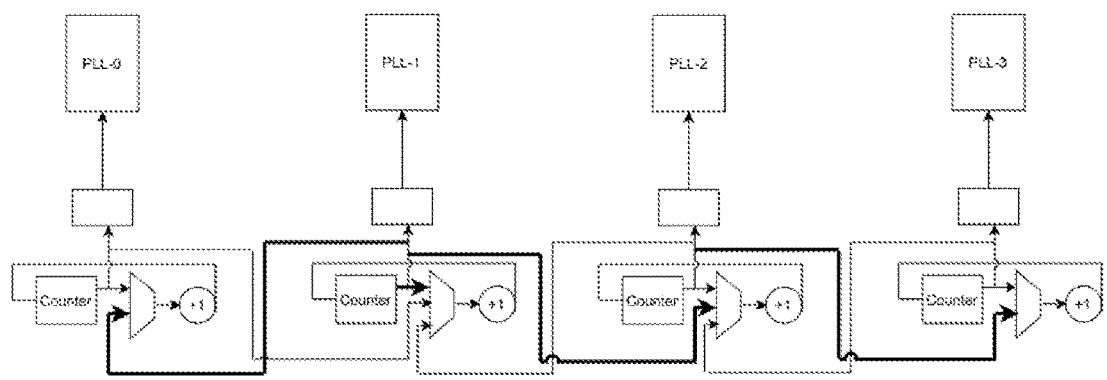
FIG. 4 illustrates a connection of the apparatus across four PLLs in accordance with an exemplary embodiment of the present invention.

FIG. 4 illustrates a connection of the apparatus (100) across four PLLs in accordance with an exemplary embodiment of the present invention. Each multiplexor (6) of the PLLs is connected to its own local counter (2) and the counters (2) of the adjacent PLLs. For example, the multiplexor (6) of PLL-2 is connected to its own local counter (2) and the counters (2) of PLL-1 and PLL-3.

In order to synchronize the output clock signals across the four PLLs, each multiplexor (6) is configured such that PLL-O's multiplexor (6) selects the count from the counter (2) of PLL-1 while PLL-1's multiplexor (6) selects the count from its own local counter (2). PLL-2's multiplexor (6) selects the count from the counter (2) of PLL-1 while PLL-3's multiplexor (6) selects the count from the counter (2) of PLL-2.

Figure 5:
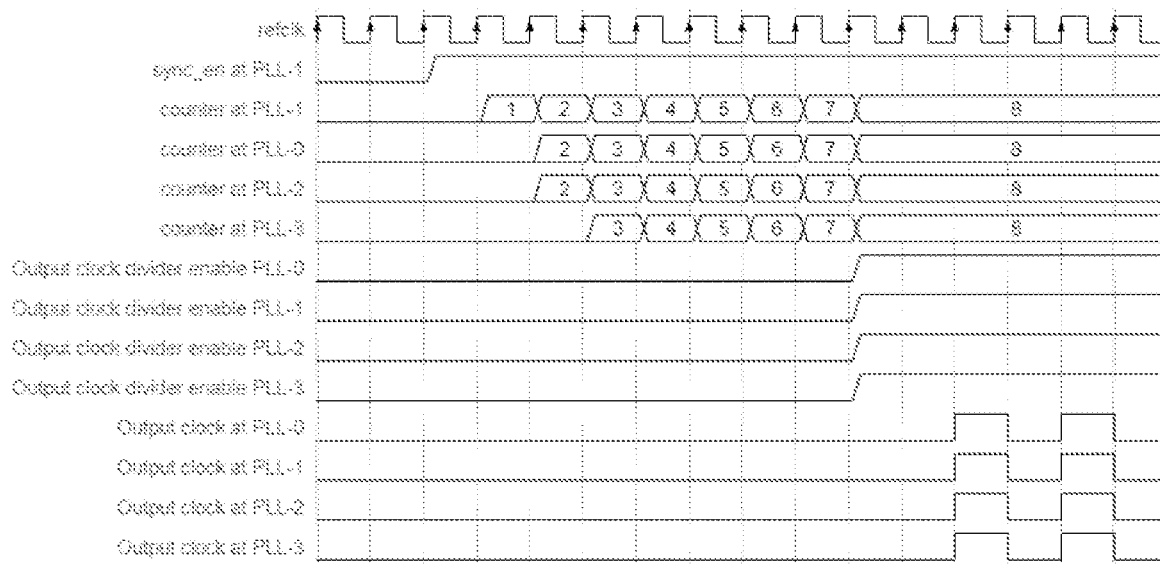
FIG. 5 illustrates a timing diagram of the four PLLs of FIG. 4.

FIG. 5 illustrates a timing diagram of the four PLLs of FIG. 4. Initially, the synchronization enable signal is asserted at PLL-1. Since PLL-1's multiplexor (6) is configured to select the count from its own local counter (2), a count of 0 will be selected by PLL-1's multiplexor (6) and the count of 0 will be incremented by 1 and directed to PLL-1's local counter (2) as a count of 1. Since PLL-0's multiplexor (6) is configured to select the count from the counter (2) of PPL-1, the count of 1 from the local counter (2) of PLL-1 will be selected by PLL-0's multiplexor (6) and the count of 1 will be incremented by 1 and directed to PLL-0's local counter (2) as a count of 2. Similarly, since PLL-2's multiplexor (6) is configured to select the count from the counter (2) of PPL-1, the count of 1 from the local counter (2) of PLL-1 will be selected by PLL-2's multiplexor (6) and the count of 1 will be incremented by 1 and directed to PLL-2's local counter (2) as a count of 2. Since PLL-3's multiplexor (6) is configured to select the count from the counter (2) of PPL-2, the count of 2 from the local counter (2) of PLL-2 will be selected by PLL-3's multiplexor (6) and the count of 2 will be incremented by 1 and directed to PLL-3's local counter (2) as a count of 3. All the counts in each local counter (2) will continue to be incremented. Further, all the counts from each local counter (2) will be continuously assessed by each comparator (4) respectively. Once the counts in each local counter (2) concurrently reach the predetermined or preconfigured value which is eight in this example, an output clock divider enable will be asserted to each PLL to start the output clock dividers simultaneously to generate the output clock signals and thus the output clock signals of all PLLs will be aligned. In this embodiment, the minimum number of reference clock signal cycles required for the count to propagate across all the PLLs is three and thus the predetermined or preconfigured value can be set to be three or above.

Figure 6:
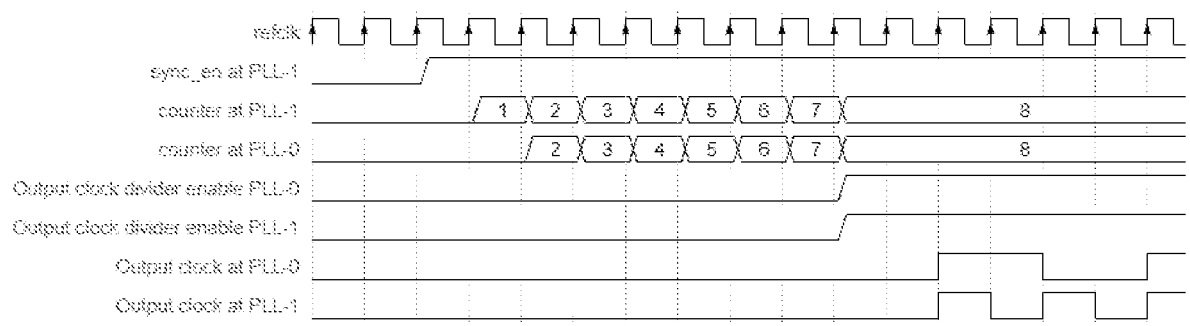
FIG. 6 illustrates a timing diagram of two PLLs with different output clock divider divisors in accordance with an exemplary embodiment of the present invention.

In the aforementioned exemplary embodiment, the output clock divider of each PLLs comprises same divisor in dividing the output clock signals and thus the output clock signals are of same frequency. However, it is also possible for the output clock divider of each PLLs to have different divisors in dividing the output clock signals. FIG. 6 illustrates a timing diagram of two PLLs with different output clock divider divisors in accordance with an exemplary embodiment of the present invention. PLL-0 has a divide-by-4 output clock signal while PLL-1 has a divide-by-2 output clock signal. Even though PLL-0 has a slower output clock signal frequency, PLL-0 and PLL-1 are still considered synchronized and the output clocks' rising edges will align with each other every two cycles of PLL-1.

Figure 7:
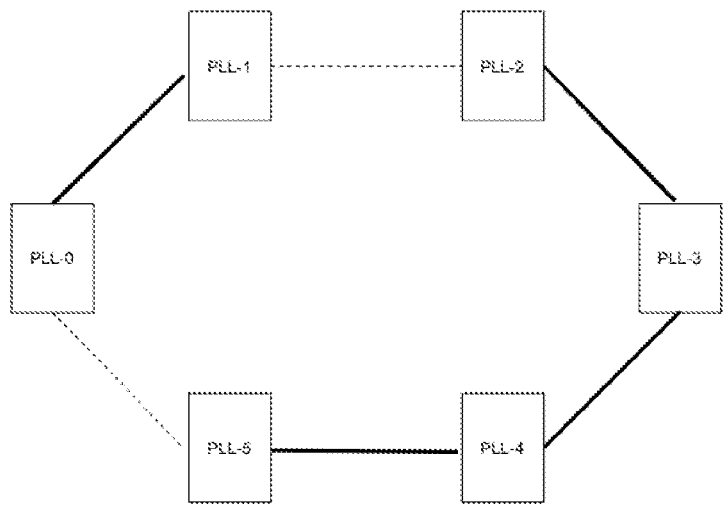
FIG. 7 illustrates a connection across six PLLs that are divided into two groups for separate synchronization in accordance with an exemplary embodiment of the present invention.

Since the select input of the multiplexor (6) of the present invention is configurable, it is achievable to create separate groups of synchronized PLLs and rearrange the groups of synchronized PPLs at any time. In one example, an application requires to synchronize PLL-0 and PLL-1 output clock signals as a group and to synchronize PLL-2, PLL-3, PLL-4 and PLL-5 output clock signals as another group as shown in FIG. 7 to meet a system requirement. Accordingly, the multiplexor (6) of PLL-0 can be configured to select the count from its own local counter (2) while the multiplexor (6) of PLL-1 can be configured to select the count from the counter (2) of PLL-0. This will allow the output clock signal of PLL-1 to be aligned with the output clock signal of PLL-0. Subsequently, the multiplexor (6) of PLL-2 can be configured to select the count from its own local counter (2) while the multiplexor (6) of PLL-3 can be configured to select the count from the counter (2) of PLL-2. PLL-4's multiplexor (6) can be configured to select the count from the counter (2) of PLL-3 while PLL-5's multiplexor (6) can be configured to select the count from the counter (2) of PLL-4. This will allow the output clock signals of PLL-3, PLL-4 and PLL-5 to be aligned with the output clock signal of PLL-2.

Figure 8:
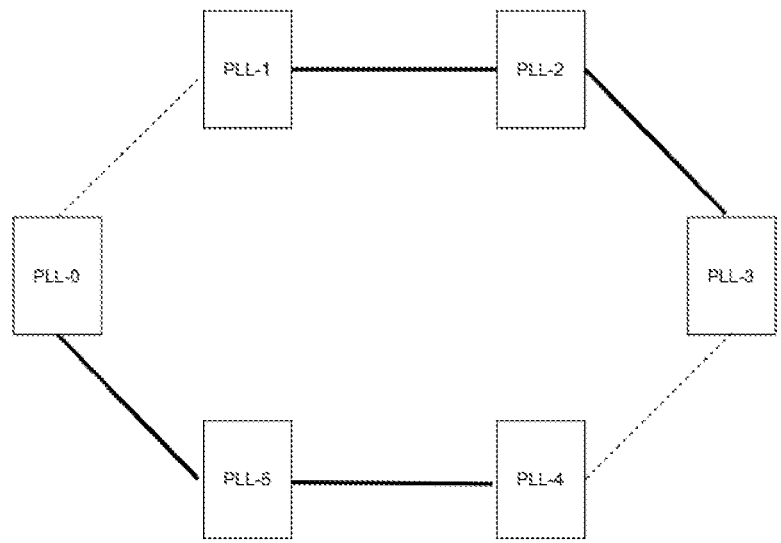
FIG. 8 illustrates another connection across six PLLs that are divided into two groups for separate synchronization in accordance with an exemplary embodiment of the present invention.

Thereafter, instead of the previous arrangement, the application requires to synchronize PLL-1, PLL-2 and PLL-3 output clock signals as a group and to synchronize PLL-0, PLL-4 and PLL-5 output clock signals as another group as shown in FIG. 8 to meet another system requirement. Accordingly, the multiplexor (6) of PLL-1 can be reconfigured to select the count from its own local counter (2) while the multiplexor (6) of PLL-2 can be reconfigured to select the count from the counter (2) of PLL-1. The multiplexor (6) of PLL-3 can be maintained to select the count from the counter (2) of PLL-2. This will allow the output clock signals of PLL-2 and PLL-3 to be aligned with the output clock signal of PLL-1. Subsequently, the multiplexor (6) of PLL-0 can be reconfigured to select the count from its own local counter (2) while the multiplexor (6) of PLL-5 can be reconfigured to select the count from the counter (2) of PLL-0. PLL-4's multiplexor (6) can be reconfigured to select the count from the counter (2) of PLL-5. This will allow the output clock signals of PLL-4 and PLL-5 to be aligned with the output clock signal of PLL-0. Even though the aforementioned two arrangements are connected in ring topology, any other suitable topologies such as star, mesh or daisy-chain topology can also be utilized in the present invention to synchronize output clock signals as long as the multiplexors (6) are configured correspondingly.

Accordingly, the above-mentioned apparatus (100) and method overcomes the problems and shortcomings of the existing solutions. For example, the apparatus (100) and method of the present invention are capable of synchronizing output clock signals across a plurality of PLLs. Further, the apparatus (100) of the present invention is configurable such that one or more PLL synchronization groups can be created and rearranged easily.

Various modifications to these embodiments are apparent to those skilled in the art from the description and the accompanying drawings. The principles associated with the various embodiments described herein may be applied to other embodiments. Therefore, the description is not intended to be limited to the embodiments shown along with the accompanying drawings but is to be providing broadest scope of consistent with the principles and the novel and inventive features disclosed or suggested herein. Accordingly, the invention is anticipated to hold on to all other such alternatives, modifications, and variations that fall within the scope of the present invention and appended claim.

In the claims which follow and in the preceding description of the invention, except where the context requires otherwise due to express language or necessary implication, the word "comprise" or variations such as "comprises" or "comprising" is used in an inclusive sense, i.e., to specify the presence of the stated features but not to preclude the presence or addition of further features in various embodiments of the invention.

The invention claimed is:

1. An apparatus for synchronizing output clock signals across a plurality of phase-locked loops, wherein the apparatus coupled within each phase-locked loop comprises:
   a local counter configured to provide a count when receiving a reference clock signal;
   a comparator configured to compare the count from the local counter with a predetermined or preconfigured value; and
   a multiplexor connected to the local counter and counters of adjacent phase-locked loops, configured to select the count from the local counter or a count from the counters of the adjacent phase-locked loops, wherein the selected count from the multiplexor is incremented and directed to the local counter, and
   an output clock divider enable is asserted to the phase-locked loop to start an output clock divider to generate the output clock signal when the count from the local counter reaches the predetermined or preconfigured value.

2. The apparatus as claimed in claim 1, wherein the plurality of phase-locked loops is divided into multiple synchronization groups by configuring the multiplexors for separate synchronization of the output clock signals.

3. The apparatus claimed in claim 2, wherein the predetermined or preconfigured value is the same for each phase-locked loop in the same synchronization group.

4. The apparatus as claimed in claim 1, wherein the local counter enabled by a synchronization enable signal.

5. The apparatus as claimed in claim 1, wherein the reference clock signal of the local counter is the same as the clock signal that drives the phase-locked loop.

6. The apparatus as claimed in claim 1, wherein the output clock divider of each phase-locked loop comprises same or different divisors in dividing the output clock signal.

7. A method for synchronizing output clock signals across a plurality of phase-locked loops, the method comprising:
   providing a count by a local counter when receiving a reference clock signal for each phase-locked loop;
   selecting the count from the local counter or a count from counters of adjacent phase-locked loops by a multiplexor connected to the local counter and the counters of the adjacent phase-locked loops;
   incrementing the count selected by the multiplexor;
   directing the incremented count to the local counter;
   comparing the count from the local counter with a predetermined or preconfigured value by a comparator; and
   asserting an output clock divider enable to the phase-locked loop to start an output clock divider to generate the output clock signal when the count from the local counter reaches the predetermined or preconfigured value.

8. The method as claimed in claim 7, further comprising: dividing the plurality of phase-locked loops into multiple synchronization groups by configuring the multiplexors for separate synchronization of the output clock signals.

* * * * *